United States Patent
Gerbi

(10) Patent No.: US 8,969,720 B2
(45) Date of Patent: Mar. 3, 2015

(54) PHOTOELECTRONICALLY ACTIVE, CHALCOGEN-BASED THIN FILM STRUCTURES INCORPORATING TIE LAYERS

(75) Inventor: Jennifer E. Gerbi, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 94 days.

(21) Appl. No.: 13/047,139

(22) Filed: Mar. 14, 2011

(65) Prior Publication Data

US 2011/0253219 A1    Oct. 20, 2011

Related U.S. Application Data

(60) Provisional application No. 61/314,840, filed on Mar. 17, 2010.

(51) Int. Cl.
| | | |
|---|---|---|
| *H01L 31/0272* | (2006.01) | |
| *H01L 21/02* | (2006.01) | |
| *C23C 14/06* | (2006.01) | |
| *C23C 14/34* | (2006.01) | |
| *C23C 14/58* | (2006.01) | |

(52) U.S. Cl.
CPC ...... *H01L 21/02568* (2013.01); *C23C 14/0623* (2013.01); *C23C 14/3464* (2013.01); *C23C 14/5866* (2013.01); *H01L 21/02614* (2013.01); *H01L 21/02631* (2013.01)
USPC .............. 136/265; 136/262; 136/264; 438/95

(58) Field of Classification Search
CPC ................... H01L 21/02631; H01L 21/02568; H01L 21/02614
USPC .............................. 136/265, 262, 264; 438/95
See application file for complete search history.

(56) References Cited

U.S. PATENT DOCUMENTS

| | | | |
|---|---|---|---|
| 4,915,745 A | 4/1990 | Pollock et al. | |
| 5,439,575 A | 8/1995 | Thornton | |
| 5,674,555 A | 10/1997 | Birkmire | |
| 6,323,417 B1 | 11/2001 | Gillespie | |
| 6,518,086 B2 | 2/2003 | Beck | |

(Continued)

FOREIGN PATENT DOCUMENTS

| | | |
|---|---|---|
| EP | 0318315 | 11/1988 |
| JP | H07-326577 | 12/1995 |

(Continued)

OTHER PUBLICATIONS

Nakada et al., "Thin Films of CuInSe2 Produced by Thermal Annealing of Multi Layers With Ultra-Thin Stacked Elemental Layers", Tenth E.C. Photovoltaic Solar Energy Conference, 1991, pp. 887-890.*

(Continued)

*Primary Examiner* — Golam Mowla

(74) *Attorney, Agent, or Firm* — Kagan Binder, PLLC

(57) ABSTRACT

The present invention provides improved chalcogen-containing, photovoltaic structures as well as related compositions, photovoltaic devices incorporating these structures, methods of making these structures and devices, and methods of using these structures and devices. According to principles of the present invention, the adhesion of PACB compositions is improved through the use of chalcogen-containing tie layers.

15 Claims, 6 Drawing Sheets

(56) References Cited

U.S. PATENT DOCUMENTS

| | | | |
|---|---|---|---|
| 6,974,976 | B2 | 12/2005 | Hollars |
| 7,867,551 | B2 | 1/2011 | Basol |
| 2005/0006221 | A1 | 1/2005 | Takeuchi et al. |
| 2005/0109392 | A1* | 5/2005 | Hollars .................. 136/265 |
| 2005/0183768 | A1 | 8/2005 | Sager et al. |
| 2006/0121701 | A1 | 6/2006 | Basol |
| 2006/0222558 | A1 | 10/2006 | Alberts |
| 2007/0004078 | A1 | 1/2007 | Alberts |
| 2007/0257255 | A1 | 11/2007 | Dhere et al. |
| 2008/0105542 | A1 | 5/2008 | Purdy |
| 2008/0121137 | A1 | 5/2008 | Van Osten et al. |
| 2008/0289953 | A1 | 11/2008 | Hollars |
| 2009/0035882 | A1 | 2/2009 | Basol |
| 2009/0050208 | A1 | 2/2009 | Basol |
| 2009/0139573 | A1 | 6/2009 | Ramasesha et al. |
| 2009/0145746 | A1 | 6/2009 | Hollars |

FOREIGN PATENT DOCUMENTS

| | | |
|---|---|---|
| WO | WO 90/15445 | 6/1990 |
| WO | WO98/48079 | 10/1998 |
| WO | WO 2004/032189 | 4/2004 |
| WO | WO 2005/017978 | 2/2005 |
| WO | WO2009/051862 | 4/2009 |
| WO | WO 2011/090728 | 7/2011 |

OTHER PUBLICATIONS

Nakada et al., "Improved Cu(In,Ga)(S,Se)$_2$ thin film solar cells by surface sulfurization," Solar Energy Materials and Solar Cells, 49, pp. 285-290, 1997.

Nagoya et al., "Role of incorporated sulfur into the surface of Cu(inGa)Se$_2$ thin-film absorber," Solar Energy Materials & Solar Cells, 67, pp. 247-253, 2001.

Chen et al, "Another Route to fabricate single-phase chalcogenides by post-selenization of Cu—In—Ga precursors sputter deposited from a single ternary target," Solar Energy Materials & Solar Cells, 93, pp. 1351-1355, 2009.

R. Friedfeld et al., "Electrodeposition of CuIn$_x$Ga$_{1-x}$Se$_2$ thin films" Solar Energy Materials & Solar Cells 58 (1999) pp. 375-385.

T. Dullweber et al., "Study of the effect of gallium grading in CU(In,Ga)Se$_2$," Thin Solid Films, 361-362 (2000), pp. 478-481.

T. Dullweber et al., "Back surface band gap in gradings in CU(In,Ga)Se$_2$ solar cells" Thin Solid Films 387 (2001), pp. 11-13.

G. Voorwinden et al., "In-line CU(In,Ga)Se$_2$ co-evaporation process with graded band gaps on large substrates" Thin Solid Films 431-432 (2003), pp. 538-542.

C. Lei et al., "Void formation and surface energies in CU(InGA)Se$_2$," Journal of Applied Physics 100, 073518 (2006), pp. 073518-1-073518-5.

Ingrid Repins et al., 19.9%-efficient ZnO/CdS/CuInGASe$^2$ Solar Cell with 81.2% Fill Factor Prog. Photovolt: Res. Appl. (2008) 16: pp. 235-239.

G. Ostberg et al., "Interfaces in CU(In,Ga)Se$_2$ thin solar cells" EMC (2008), vol. 2: Materials Science, pp. 661-662.

A. Drici et al., "CU(In$_1$—Ga$_x$)Se$_2$ co-evaporated thin films from simple tungsten baskets—Influence of the gallium source" Materials Chemistry and Physics 110 (2008), pp. 76-82.

M. Powalla et al., "Highly efficient CIS solar cells and modules made by the co-evaporation process" Thin Solid Films 517 (2009), pp. 2111-2114.

R. Friedfeld et al., "Fabrication of CU(In,Ga)Se$_2$ thin film solar cell absorbers" Current Applied Physics 10 (2010) pp. S146-S149.

U.S. Appl. No. 60/290,490, filed Dec. 28, 2010, Jackrel et al.

Goushi et al., "Fabrication of pentanary Cu(InGa) (SES)2 absorbers by selenization and sulfurization", Solar Energy Materials & Solar Cells, 93 (2009) 1318-1320.

* cited by examiner

PHOTOELECTRONICALLY ACTIVE, CHALCOGEN-BASED THIN FILM STRUCTURES INCORPORATING TIE LAYERS

PRIORITY

The present nonprovisional patent application claims priority under 35 U.S.C. §119(e) from U.S. Provisional patent application having Ser. No. 61/314,840, filed on Mar. 17, 2010, by Gerbi et al. and titled CHALCOGENIDE-BASED MATERIALS AND IMPROVED METHODS OF MAKING SUCH MATERIALS, wherein the entirety of said provisional patent application is incorporated herein by reference.

FIELD OF THE INVENTION

The present invention relates to methods for making chalcogenide-based photoabsorbing materials as well as to photovoltaic devices that incorporate these materials. More specifically, the present invention relates to methods for making chalcogenide-based photoabsorbing structures in which a first, chalcogen-containing film with a relatively fine grain structure is used to enhance overall electronic performance, reduce electrical defects, reduce overall cost, and/or enhance the adhesion of a second chalcogen-containing film to an underlying substrate.

BACKGROUND OF THE INVENTION

Both n-type chalcogenide materials and/or p-type chalcogenide materials have photovoltaic functionality (also referred to herein as photoelectronicially active, photoabsorbing or photoactive functionality). These materials absorb incident light and generate an electric output when incorporated into a photovoltaic device. Consequently, these chalcogenide-based photoabsorbing materials have been used as the photovoltaic absorber region in functioning photovoltaic devices. These compositions shall be collectively referred to hereinafter as photoelectronically active, chalcogen-based (PACB) compositions.

Illustrative PACB compositions often include sulfides, selenides, and/or tellurides of at least one or more of copper (Cu), indium (In), gallium (Ga), and/or aluminum (Al). Selenides and sulfides are more common than tellurides. Specific chalcogenide compositions have been referred to in the industry by acronyms such as CIS, CIGS, CIGSS, CIG, CIGT, CIGAT compositions, or the like, to indicate the composition constituents.

According to one proposed technique for manufacturing PACB structures, deposition methods are used in an initial stage to deposit and/or co-deposit the desired PACB constituents in one or more layers to form precursor film(s). At least a portion and sometimes all of the chalcogen(s) might not be included in the precursor film(s) at this stage. Instead, all or a portion of the chalcogen content might be incorporated into the precursor via chalcogenization at a later processing stage. Chalcogenization often involves a thermal treatment of the precursor film(s) in the presence of chalcogen(s). This kind of thermal treatment not only incorporates chalcogen into the precursor but also converts the crystal structure of the film(s) into a more suitable crystal form for photoactive functionality. Because chalcogenization occurs after the precursors are at least partially formed, industry refers to these techniques as "post-chalcogenization" processes.

There are many serious challenges to overcome with this approach. As one challenge, chalcogenizing a precursor tends to induce significant volume expansion of the film, and/or the significant diffusion of components in the precursor. These mechanisms can cause mechanical stresses that reduce adhesion, induce stresses, and/or cause other problems. Additionally, very large voids tend to form in large part at the bottom of the film adjacent the backside contact (e.g., a Mo layer in many instances) as a consequence of chalcogenizing the precursor. These large voids tend to cause adhesion problems between the PACB layer and the backside contact layer. Electronic performance and service life also can be seriously compromised. These large voids also can induce mechanical stresses that lead to delamination, fractures, and the like. It remains very desirable to find a way to modify, reduce or even eliminate total number, size, and even location of these voids in the finished PACB film. It also would be highly desirable to be able to improve the adhesion characteristics of these PACB films. Adhesion problems become even more critical in roll-to-roll processes, particularly when techniques such as screen printing are used to form features such as collection grids.

As another drawback, the raw materials used to form PACB thin films are quite expensive. It is highly desirable to drive down these costs. One way to accomplish this would be to deposit thinner PACB films so that less material is used per device. However, the electronic characteristics of thinner PACB films tend to be seriously compromised and even crippled as the thickness is reduced. It remains desirable to find a way to sputter or otherwise form thinner PACB films that still would offer adequate electronic characteristics.

SUMMARY OF THE INVENTION

The present invention provides improved chalcogen-containing, photovoltaic structures as well as related compositions, photovoltaic devices incorporating these structures, methods of making these structures and devices, and methods of using these structures and devices. According to principles of the present invention, the adhesion of PACB compositions is improved through the use of chalcogen-containing tie layers. In a typical approach of the present invention, a tie layer initially is formed on a substrate and then a PACB composition is formed on the tie layer.

The tie layers not only improve adhesion but also improve overall electronic performance of the resultant devices. For example, as compared to otherwise similar devices without tie layers, data have shown that photovoltaic cells incorporating PACB compositions formed on such tie layers tend to have higher average efficiency, less performance variability from device to device, better absorption of light over a large wavelength range, and reduced large scale defects. Significantly, the tie layers also allow thinner, high quality PACB films to be formed that would not be feasible in the absence of the tie layers. The principles of the present invention are well suited for industrial scale processes, including roll-to-roll processing that may involve screen printing to deposit device features or precursors thereof, such as collection grids.

The tie layers are compositionally similar to PACB compositions in that the tie layers in many embodiments include at least Cu, In, and at least one chalcogen. The tie layers also may include one or more of the other kinds of ingredients included in PACB compositions, including but not limited to gallium (Ga), and/or aluminum (Al), and/or the like. Indeed, in some embodiments, the constituents and optionally the proportions thereof of the tie layer and the PACB layer may be substantially the same. However, the tie layers have a different morphology that favors tie layer functionality. In some embodiments, this is achieved by forming thin, tie layer precursors at lower temperatures. Upon thermal treatment optionally in the presence of chalcogen, these tie layer precursors tend to be converted to a PACB composition comprising a crystal grain structure that on average is much finer than crystalline structures associated with PACB compositions that are more optimized for electronic performance. The fine grain texture has been observed to correlate to improved adhesion. In some embodiments the tie layer precursor composition as deposited is measurably less crystalline than the resultant tie layer formed as a result of post-chalcogenization and/or post-annealing. Without wishing to be bound, it is believed that at least portions of the tie layer precursor PACB composition as deposited might be amorphous.

In one aspect, the present invention relates to a method of making a chalcogen-containing photoabsorbing structure, comprising the steps of:
  (a) forming a first photoactive film or a precursor thereof comprising at least Cu, In, and at least one chalcogen; and
  (b) forming a second, photoactive film or a film precursor directly or indirectly on the first film, said film comprising at least Cu and In; and
  (c) subjecting at least one of the first and second films and/or precursors thereof to an annealing and/or chalcogenization treatment under conditions effective to convert at least one of the first and second films to a crystalline PACB composition.

In another aspect, the present invention relates to a method of making a chalcogen-containing photoabsorbing structure, comprising the steps of:
  a) forming at least a portion of a first photoactive film or a precursor thereof comprising at least Cu, In, and at least one chalcogen, wherein at least a portion of said forming occurs at a temperature of less than about 350° C.; and
  b) forming a second, photoactive film or film precursor thereof directly or indirectly on the first film, said film comprising at least Cu and In; and
  c) subjecting at least one of the first and second films and/or precursors thereof to an annealing and/or chalcogenization treatment under conditions effective to form a crystalline PACB composition.

In another aspect, the present invention relates to a photovoltaic device, comprising:
  a) a substrate;
  b) a first PACB region formed directly or indirectly on the substrate, wherein the first PACB region comprises Cu, In, and at least one chalcogen, and wherein at least a major portion of the first PACB region comprises crystalline grains having a size under 100 nm as measured by XTEM and an average thickness for the region of less than about 200 nm; and
  c) a second PACB region formed directly or indirectly on the first region, wherein the second region comprises Cu, In, and at least one chalcogen; wherein the combined thickness of first and second regions is less than 1000 nm.

In another aspect, the present invention relates to a photovoltaic device, comprising:
  a) a substrate;
  b) a first PACB region formed directly or indirectly on the substrate, wherein the first region comprises Cu, In, and at least one chalcogen, and wherein the first region has a thickness under about 200 nm; and
  c) a second PACB region formed directly or indirectly on the first PACB region, wherein the second PACB region comprises Cu, In, and at least one chalcogen, wherein the second PACB region has a thickness in the range from about 200 nm to about 1000 nm, and wherein the first PACB region has a smaller average crystalline grain size as measured by XTEM than the second PACB region.

DETAILED DESCRIPTION OF PRESENTLY PREFERRED EMBODIMENTS

Figure 1:
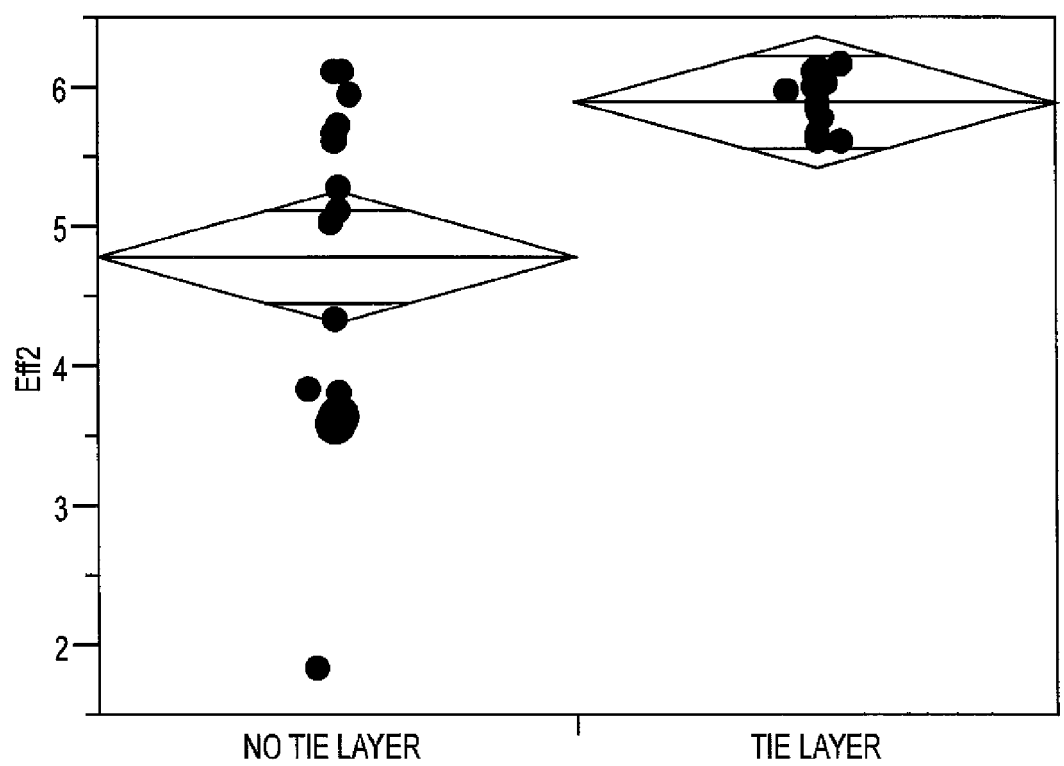
FIG. 1 is a graph referred to in Example 3 below that shows efficiency results for eight photovoltaic (PV) cells formed with a tie layer (data points on right side of graph) and eight photovoltaic cells formed without a tie layer (data points on left side of graph).

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. All patents, pending patent applications, published patent applications, and technical articles cited herein are incorporated herein by reference in their respective entireties for all purposes.

The present invention provides methods for making chalcogen-containing, photo electronically active structures. As an overview, a first PACB film is formed to function at least in part as a tie layer to enhance the adhesion of another, second PACB film to an underlying substrate. The second PACB film is formed directly or indirectly, preferably directly, on the first film. The first film is prepared in a manner effective to promote adhesion characteristics rather than the electronic characteristics of the first film. In the meantime, the second PACB film is deposited in a manner effective to promote electronic performance. Using the first and second films in combination provides an overall PACB structure that shows not only improved adhesion but also improved electronic performance relative to using either film alone. The ability of the combination to boost overall electronic performance is surprising in view of the relatively poor electronic performance of the first film on its own.

The first PACB film, also referred to herein as a tie layer, has a composition and is prepared in a manner such that the first film is formed on and shows excellent adhesion to a wide range of substrates proximal to one major face of the first film while also showing excellent adhesion to PACB compositions that are formed on and proximal to the other major face of the first film. In some embodiments, the first film is formed on a substrate surface comprising at least molybdenum. In representative devices, molybdenum can be used to form at least a portion of a back contact incorporated into a corresponding photovoltaic device.

The tie layer provides improved adhesion characteristics. While not wishing to be bound by theory, it is believed that the improved adhesion is due at least in part to a shift in void characteristics that results when a tie layer is used. In the absence of a tie layer, large voids in a PACB photoabsorbing composition tend to form at the interface between the PACB layer and the underlying substrate surface. For example, XSEM analysis was performed on a PACB cell including a PACB layer formed on a Mo surface. The XSEM analysis showed that voids in the PACB absorber region form upon post-selenization and that many of these voids form at the interface between the PACB material and the Mo. In contrast, when a tie layer is used, XSEM analysis shows that similar voids tend to form at the interface between the PACB layer and the tie layer. The tie layer helps to shift the voids away from interface between the PACB layer and the Mo. Because the resultant tie layer and overlying PACB layer may be compositionally similar (even though the morphology of the two layers may differ), it can be said that the voids now are primarily internalized.

Surprisingly, strong adhesion occurs at the interface between the PACB composition and the tie layer even though voids in the PACB composition are formed at this internal interface. While one might expect that the adhesion issues are merely shifted from one interface to another, data show that this void shift correlates to dramatic improvements in adhesion. The internalized voids also may be a factor that helps to reduce the risk of shunts to improve electronic performance of the resultant devices.

Without wishing to be bound by theory, another factor that is believed to enhance adhesion characteristics is that the tie layer undergoes substantially less volume expansion upon annealing and/or post-chalcogenization than does a PACB precursor that is used to form PACB compositions. It is believed that the low volume expansion is due at least in part to the incorporation of one or more chalcogen(s) into the tie layer as deposited. Note that additional chalcogen content may be incorporated into the tie layer by later processing, e.g., a chalcogenization treatment performed after all or a part of the tie layer has already been formed.

As still yet another factor that is believed to enhance adhesion, data of representative tie layer embodiments show that smaller voids form in the tie layers upon annealing and/or post-chalcogenation than are observed with respect to the larger voids that result when PACB precursor compositions more optimized for electronic performance are post-chalcogenized to form PACB compositions. Moreover, the smaller voids in the tie layer also tend to be uniformly distributed throughout the tie layer cross section rather than being more heavily concentrated at interface(s). Thus, the tie layers tend to have substantially less large scale voids at the interface with the underlying substrate, e.g., a Mo surface that might otherwise cause adhesion issues.

The elemental profile of the tie layer composition can be stable upon annealing or post-chalcogenization. For example, data have been obtained to show that Ga profiles in tie layer embodiments is generally the same before and after annealing and/or post-chalcogenization, when a suitable amount of chalcogen is included in the layer.

The tie layer also enhances electronic performance of resultant photovoltaic devices. The ability of a tie layer to improve the electronic performance is surprising, because the tie layer itself has poor electronic characteristics and functions poorly on its own as a photoelectronically active composition.

In one experiment, the impact of using a tie layer of the present invention upon efficiency of photovoltaic cells was studied. Cells including PACB compositions supported upon tie layers were compared to otherwise identical cells having no tie layer. The PACB layers in these cells were obtained from sputtered precursors including Cu, In, and Ga. These precursors had no chalcogen content as deposited. These precursors were post-selenized to form the PACB material. The tie layers also included Cu, In, Ga, and Se, but were formed by initially depositing a composition that had an amorphous (i.e. substantially or entirely non-crystalline) morphology and later crystallized as described herein. The average efficiency of the cells including a tie layer was about 5.7%. Further, the efficiency for the tie layer samples were within a relatively tight range from about 5.5% to about 6.3%. In contrast, the average efficiency of the comparison cells without tie layers was only about 4.7%. Moreover, uniformity was also worse as efficiencies for the samples without a tie layer ranged from below 2% to 6.3%. In short, the samples with a tie layer showed higher average efficiency and reduced variability in efficiency characteristics.

The light absorption characteristics of these two kinds of samples also were studied in terms of quantum efficiency as a function of wavelength of incident light over a wavelength range from about 250 nm to about 1400 nm. Higher quantum efficiency generally indicates more absorption. The samples having a tie layer showed significantly more absorption in the wavelength range from about 500 nm to about 1300 nm even though both sets of samples had comparable band gap characteristics. The improved absorption of the samples including tie layers indicates reduced electronic defects.

Similar efficiency data also were obtained from cells in which the PACB layer was obtained from PACB precursors including sub-stoichiometric amounts of chalcogen before being post-selenized to form PACB compositions. One set of these samples included tie layers. The other samples were similar but included no tie layers. Although all the samples showed a comparable variation in efficiency, the average and maximum efficiency for the cells with tie layers was much higher. For the cells with tie layers, the efficiencies ranged from about 3% to nearly 7% with an average efficiency of about 5.5%. In contrast, the efficiencies of the samples without tie layers ranged from about 1% to about 4.5% with an average efficiency of about 3.4%.

The use of the tie layer also allows a thinner PACB layer more optimized for electronic performance to be formed on the tie layer than would otherwise be feasible in the absence of a tie layer. Such unconventionally thin PACB layers would perform very poorly from an electronic perspective, if at all, in absence of a tie layer. But, these thin PACB layers show excellent electronic properties when used in combination with a tie layer. Ultra thin PACB materials not only would be very cost effective but also would provide excellent cross-section for absorption as literature reports that light absorption tends to occur in top 235 nm of PACB films as measured by quantum efficiency with PV device modeling. See A Rockett, IEEE PVSC 33 Tutorial Notes, 2008.

For example, conventional PACB layers often have thicknesses of at least about 1.5 micrometers to about 3 micrometers. Advantageously, tie layers of the present invention may be used with such relatively thick or even thicker PACB photoabsorbing layers to boost adhesion or electronic performance of the resultant devices. Yet, use of a tie layer not only boosts the electronic performance of PACB layers in these conventional thickness regimes but allows even thinner layers to be used. In some representative embodiments, PACB layers formed on tie layers of the present invention have thicknesses of less then 1.5 micrometers, preferably less then 1 micrometer, more preferably less than 800 nm, and most preferably less than 500 nm. The thickness is typically more than 100 nm, more preferably more than 200 nm. In some embodiments, the thickness of the PACB layer is in the range from about 200 nm to about 1 micrometer, even in the range from about 300 nm to about 800 nm, or even about 350 nm to about 450 nm.

Without wishing to be bound, it is believed that one factor contributing to improved electronic performance is that the tie layer is readily deposited as a thin, continuous layer, and remains this way after post-processing. The continuous character of the tie layer film allows thin PACB compositions to be formed on top of tie layer without undue risk that voids or other gaps in the PACB layer might extend all the way through to the underlying substrate and give rise to shunts. In the absence of the tie layer, more shunts may result that tend to cripple the electronic performance of thinner PACB layers.

In the practice of the present invention, film thickness is measured by taking a focused ion beam (FIB) cross section of a sample from the active area of the photovoltaic device, and then viewed by scanning electron microscopy (SEM). The cross-section should include an active area that is about 200 micrometers wide. A 10 micrometer interval is located within the center of the 200 micrometer cross-section. The thickness is given as the average thickness averaged over the 10 micrometer interval at five separate data points that are generally equally spaced across the 10 micrometer interval, wherein two data points are taken at each end of the interval. The film thickness measurements are corrected for any tilt effects.

The first film desirably includes at least Cu, In and at least one chalcogen. The ingredients incorporated into the first film also may include one or more other optional constituents. In preferred embodiments, optional constituents include at least one of Ga, Al, or combinations of these. Other optional constituents include Na, Li, S, O, combinations of these, and the like.

The amount of In and optional Ga and/or Al incorporated into the first film may vary over a wide range. Desirably, the atomic ratio of the total amount of In, Ga (if any), and Al (if any) included in the film to the amount of Cu in the film is at least about 1.0, preferably at least about 1.1, more preferably at least about 1.2. This atomic ratio is often less than about 2.0, or even less than about 1.8, or even less than about 1.7. When this ratio is 1, the film includes a stoichiometric amount of In, Ga (if any), and Al (if any) relative to Cu. When the ratio is greater than one, the In, Ga (if any), and Al (if any) are in stoichiometric excess relative to Cu. When the ratio is less than one, the Cu is in stoichiometric excess relative to these materials. A ratio greater than 1 is preferred in order to reduce the probability of deep electronic defects due to an excess of Cu. Some or all of the In, Ga (if any), and Al (if any) may be incorporated into the first film as deposited. Optionally, a portion may be added in later processing steps after an initial portion of the film constituents are deposited.

The amount of Ga (if any) and Al (if any) included in the first film composition may vary over a wide range. As general guidelines, illustrative first film compositions include an atomic ratio of (Ga+Al)/In of at least about 0, preferably at least about 0.1, more preferably at least about 0.6. This atomic ratio often is less than about 10, preferably less than about 5, more preferably less than about 0.6.

Chalcogens incorporated into the first film generally include one or more of Se, S, and/or Te. Se and/or S are more preferred.

The amount of chalcogen(s) included in the first film as deposited may vary over a wide range. The chalcogen(s) can be present in an amount that is sub-stoichiometric, stoichiometric, or a stoichiometric excess. In a stoichiometric composition the atomic ratio of the total chalcogen content to the total metal content (Cu+In+Ga+Al) is 1.

Chalcogens are in stoichiometric excess when the ratio is greater than 1. Metals are in excess when the ratio is less than 1. All or a portion of the desired chalcogen content can be incorporated into the first film as deposited. Optionally, additional chalcogen content can be incorporated into the film at a later processing stage such as by using post-chalcogenization techniques.

Generally, greater amounts of chalcogen incorporated into the first precursor film as deposited desirably lead to smaller crystallite grain sizes after post-processing. This favors tie layer functionality while also minimizing volume expansion and undue void formation upon annealing or post-chalcogenization. For example, incorporating a near-stoichiometric amount of Se into a first film also including Cu, In, and Ga promotes smaller crystal grains in the range from about 8 nm to about 50 nm, after post-selenization and annealing, performed concurrently. This kind of morphology is too finely structured for better electronic performance, yet the fine texture helps to provide excellent adhesion for tie layer purposes. The morphology also enhances the electronic properties of overlying PACB compositions. In contrast, PACB compositions with more suitable electronic properties often have crystal grain sizes in the range from 0.3 to about 1 micrometer or even larger.

Incorporating too much chalcogen content into the first film as deposited poses some challenges, however. For instance, when using sputtering techniques to form the first film, the risk of chalcogen depletion in targets tends to increase with increasing chalcogen content when the first film is formed using sputtering techniques.

Balancing factors including desired crystal grain size against target depletion issues, the first film as deposited includes at least about 50 percent, more preferably at least about 60 percent of the stoichiometric amount of chalcogen(s) relative to (Cu+In+Ga+Al). In many embodiments, the first film as deposited includes no more than about 150 percent, preferably no more than about 100 percent, and even less than about 85 weight percent of such stoichiometric amount. In one embodiment, forming a first film including 80 percent of the stoichiometric amount of chalcogen(s) would be suitable.

Additional chalcogen content optionally may be added to the first film during subsequent processing such as during a post-chalcogenization treatment. Desirably, precursors of both the first and second films are deposited and then both films are chalcogenized and/or annealed at the same time in one or more processing steps.

In the practice of the present invention, the crystal grain size of a sample can be determined by cross-sectional transmission electron microscopy, using the standard sample preparation methods.

Desirably, the first film as deposited is not as crystalline as the first film post-processing. This is evidenced by a detectably smaller PACB grain size as detected by XRD, including a broad "background" indicative of a loss of long-range order in the sample. This can also be measured during XTEM by using diffraction patterns, where the first film as deposited shows faint and diffuse "rings" at the expected radii for PACB material. This is compared to the first film as after being post-processed, where a clear diffraction pattern is produced.

Specific examples of first film compositions of the present invention include the following formulations Cu, In, Ga, Se
Cu, In, Ga, Se, S
Cu, In, Ga, S
Cu, In, Al, Se
Cu, In, Al, Se, S
Cu, In, Al, S
Cu, In, Ga, Al, Se
Cu, In, Ga, Al, S
Cu, In, Ga, Al, Se, S In these formulations, the molar ratio of CH:(Cu+In+Ga+Al) is in the range from 1:2 to about 2:2, wherein CH represents the total amount of chalcogen(s) included in the formulation; and the molar ratio of (In+Ga+Al)/Cu is in the range from 1.0 to 1.8 wherein Ga and Al are optional.

In a particular embodiment in which the first film incorporates Cu, In, Ga, and Se, a formulation characterized by atomic ratios of Se/Cu of 1.23 with (Ga+In)/Cu of 1.12 would be suitable.

The first film can be formed using a wide range of techniques or combinations. Exemplary techniques include sputtering, evaporation, chemical vapor deposition, electrodeposition, and combinations of these. For industrial scale purposes, techniques that are compatible with roll to roll or large area vacuum processing are preferred.

In many embodiments, sputtering techniques are used to deposit all or a portion of the first film onto, a desired substrate. One or more targets can be used to accomplish sputtering. If multiple targets are used, confocal sputtering techniques can be used. Targets can be a single phase or multiple phases. In one mode of practice, an exemplary target includes $Cu_xIn_yGa_zSe_m$, wherein x, y, z, and m are 1, 0.8, 0.2, 2 respectively, although many other compositions are possible.

At least a portion of the first film precursor desirably is formed at one or more temperatures that generally are lower than the deposition temperatures that are more useful to form PACB precursors having a crystal morphology that can lead to PACB compositions with high quality electronic characteristics upon post-chalcogenization. Instead, the deposition temperatures used to form good tie layers tend to initially form films with an amorphous morphology which then is converted into a crystalline morphology having more finely textured crystal grains than a PACB layer optimized for high quality electronic characteristics, or alternatively, such films are formed directly with small crystal grains.

In many embodiments at least a portion of the first film is deposited at one or more temperatures less than about 350° C., preferably less than about 200° C., more preferably less than about 100° C., even more preferably less than about 80° C. In many embodiments, this temperature is at least about 0° C., preferably at least about 15° C., more preferably at least about 65° C. Note that the process of sputtering slightly heats up the sample during deposition. Thus, in-situ thermocouples showed that the sample temperature was about 65° C. when sputtering with the substrate not otherwise intentionally heated.

In many embodiments at least a portion of the first film is deposited at one or more sputter pressures less than about 50 mTorr, preferably less than about 10 mTorr, more preferably less than about 4 mTorr. In many embodiments, this sputter pressure is at least about 1 mTorr. It is advantageous to use as low sputter pressures as are achievable in the sputter system in order to maintain the kinetic energy of the sputtered species, and thus form a dense, conformal tie layer film.

After the deposition of at least a portion of the constituents of the first film, the first film may be further processed in one or more additional ways. The additional processing (if any) may occur before, after, and/or during the formation of the second film (described further below).

As one option, the first film may be heat treated (also referred to as annealing) and/or post-chalcogenized. When the first film is annealed, the size and number of crystallites in the film generally increases. Desirably, the first film precursor is chalcogenized and/or annealed during the growth, chalcogenization, or annealing of the second film.

Annealing may occur under a wide range of conditions. In exemplary embodiments, annealing occurs at a temperature in the range from about 400° C. to about 700° C. for a time period of 10 seconds to about 20 minutes in a protected atmosphere, optionally including chalcogen if post-chalcogenization and annealing are to be conducted at the same time, which is preferred.

At least a major portion of the first film after post-processing desirably has a finely textured, crystalline morphology characterized by crystalline grains having a size, as measured parallel to the plane generally defined by the interface of the tie layer and underlying electronic contact layer (often including at least Mo), of less than about 300 nm, preferably less than about 200 nm, more preferably less than about 100 nm, even more preferably less than about 50 nm, most preferably less than about 30 nm. In many embodiments, this size is at least about 5 nm, more preferably at least about 10 nm, more preferably at least about 20 nm. In one embodiment, a first film embodiment having a major portion of crystalline grains in a size from about 20 nm to about 30 nm would be suitable. We note these grains can have longer dimensions in the direction perpendicular to the plane defined by the interface of the tie layer and underlying electronic contact layer.

A major portion refers to at least 50 percent, preferably at least about 60 percent, and more preferably at least about 80 percent of a film.

Crystalline grain size characteristics of a film can be determined by X-ray diffraction or cross-sectional transmission electron microscopy (XTEM).

The crystalline morphology of the resultant tie layer generally is finer than that of the resultant PACB composition of the overlying second film that is formed on the tie layer. Notwithstanding this finer texture, it is believed that the tie layer still has complementary crystalline properties to serve as a template for high quality crystal growth of overlying PACB precursors. These overlying precursors then can be converted into photoabsorbing compositions with enhanced electronic properties.

The first film may have a thickness in a wide range. Thinner first films are more preferred for better balance between adhesion and overall electronic performance of the resultant device. In particular, data show that efficiency of cells tends to increase with decreasing thickness of the tie layer. In many embodiments, the thickness is at least about 5 nm, preferably at least about 10 nm. Often, this thickness is less than about 500 nm, preferably less than about 200 nm, more preferably less than about 50 nm.

Next, a high quality, chalcogenide-based photoabsorbing second film is formed on the first film. The second film may be formed from one or more layers. As an overview, the photoabsorbing film is formed by a methodology that desirably occurs in at least two stages. In an initial stage, a second film is formed directly or indirectly, preferably directly on the first film, wherein the second film comprises a precursor of a chalcogen-containing photoabsorbing composition. Alternatively, the second layer may be deposited with a process that does not require post-annealing or post-selenization, such as evaporation. In this case, the first layer is effectively annealed and selenized during the growth step of the second layer.

If the second film is formed from a precursor, such precursors tend to include a deficiency of chalcogen relative to the amount of chalcogen desired in the final photoabsorbing composition. In some embodiments, no chalcogen is incorporated into the precursor as deposited. Thus, in a further stage, the precursor is subjected to a chalcogenization treatment to provide the second film with the desired chalcogen content. If desired, the film optionally also can be subjected to a crystallization treatment such as by annealing or the like to convert the precursor to a more desirable tetragonal chalcopyrite crystalline form, to increase grain size, and/or the like. Crystallization (e.g., annealing) and chalcogenization can occur separately, in overlapping fashion, and/or simultaneously. Conveniently, the precursor film can be subjected to a thermal treatment in the presence of one or more chalcogens that accomplishes both chalcogenization and crystallization.

The present invention is versatile and can be used with a wide range of precursor compositions. These precursors can be essentially free of chalcogen until post-chalcogenized. Alternatively, precursors can be deposited that include at least a portion of the desired chalcogen content.

In many embodiments, the second precursor film formed on the tie layer independently has a composition that includes constituents as described above with respect to the first film. However, the constituents of the first and second films may be independently selected from these choices so that the actual ingredients and/or proportions thereof included in the two layers may be the same or different. The precursor, second film may differ from the first tie layer film at least in terms of being deposited under conditions that favor a second film morphology more suitable for forming photovoltaically active material. In many embodiments, this corresponds to precursors that can be converted into PACB films in which a major portion of the PACB film has a crystal grain size of greater than 100 nm, preferably greater than 300 nm, more preferably greater than about 0.5 micrometer, and even greater than about 1.0 micrometers in some embodiments. This larger grain texture is more suitable for providing the kinds of electronic characteristics needed for photovoltaic activity as compared to the finer grain texture that is more suitable for the tie layer.

Examples of suitable precursor films and methods of forming such films are widely known. By way of example, exemplary precursor films and method of making precursor films are described in U.S. Ser. No. 12/974,643, filed Dec. 21, 2010, by Popa et al., titled MOISTURE RESISTANT PHOTOVOLTAIC DEVICES WITH ELASTOMERIC, POLYSILOXANE PROTECTION LAYER; U.S. Provisional Application Ser. No. 61/346,515, filed May 20, 2010, by Nichols et al., titled CHALCOGENIDE-BASED MATERIALS AND METHODS OF MAKING SUCH MATERIALS UNDER VACUUM USING POST-CHALCOGENIZATION TECHNIQUES; U.S. Ser. No. 13/005,422, filed Jan. 12, 2011, by Feist et al., titled PHOTOVOLTAIC DEVICE WITH TRANSPARENT, CONDUCTIVE BARRIER LAYER; U.S. Ser. No. 12/912,205 filed Oct. 26, 2010, by Bryden et al., titled MANUFACTURE OF N-TYPE CHALCOGENIDE COMPOSITIONS AND THEIR USES IN PHOTOVOLTAIC DEVICES; U.S. Provisional Application Ser. No. 61/314,840, filed Mar. 17, 2010, by Gerbi et al., titled CHALCOGENIDE-BASED MATERIALS AND IMPROVED METHODS OF MAKING SUCH MATERIALS; U.S. Provisional Patent Application Ser. No. 61/294,878, filed Jan. 14, 2010, by Elowe et al., entitled MOISTURE RESISTANT PHOTOVOLTAIC DEVICES WITH EXPOSED CONDUCTIVE GRID; and U.S. Ser. No. 13/005,420, filed Jan. 12, 2011, by DeGroot et al., titled MOISTURE RESISTANT PHOTOVOLTAIC DEVICES WITH IMPROVED ADHESION OF BARRIER FILM. Each of these patent applications is incorporated herein by reference in its respective entirety for all purposes. Such applications shall be referred to hereinafter as the "PACB Patent Documents."

The second precursor films as deposited may have a thickness in a wide range. Generally, if the overall film is too thin, the layer may not be continuous after post-processing or may yield a final film have a low cross-section for capturing incident light. Layers that are too thick are wasteful in that more material would be used than is needed for effective capture of incident light. Thicker layers also present more recombination defect opportunities for the charge carriers, which could degrade cell efficiency.

Balancing such concerns, exemplary embodiments of second reacted, PACB films post-selenization and/or post-annealing have a thickness of at least about 200 nm, preferably at least about 300 nm. In many embodiments this thickness is less than about 5 micrometers, preferably less than about 3 micrometers, more preferably less than about 2 micrometers. Unconventionally thin embodiments of the reacted, PACB films post-selenization and annealing generally have a thickness of under 1 micrometer, preferably under about 800 nm, more preferably under about 600 nm, even more preferably under about 500 nm.

It is a significant advantage that tie layer films allow atypically thin PACB films to be formed on the tie layers that still display excellent electronic performance. Without tie layers, such thin PACB films would have poor if any electronic performance. In particular, the efficiency of solar cells was studied as a function of the thickness of the PACB absorber layer, wherein the PACB layers were formed by post-selenizing corresponding precursors. Significantly absorber layers having an average thickness of less than about 500 nm and supported upon tie layers were used to form cells having efficiencies ranging from about 2% to about 7% with an average efficiency of about 5.8%. This is remarkable in that such thin PACB absorber layers would likely not work at all in the absence of a tie layer. Further, the adhesion of the thin absorber layers to the underlying tie layers was excellent. In the absence of a tie layer, the adhesion of the PACB absorber layer to an underlying, conventional substrate would be expected to be extremely poor.

Efficiency drops only slightly as the thickness of the absorber layer is decreased. For example, cells including PACB absorber layers having a thickness of about 1 micrometer showed an average efficiency of about 6.3% when supported on tie layers. Remarkably, the average efficiency dropped only slightly to about 5.7% for comparable cells having PACB absorber layers with a thickness of about 450 nm. The ability to maintain such a high level of efficiency when using such thin absorber layers is quite surprising as conventional structures having absorber layers this thin would be expected to be show substantially no efficiency.

Illustrative embodiments of photovoltaic cells include those in which the combined thickness of the first and second films is less than 1000 nm, under 800 nm, under 500 nm, under 450 nm.

The second film precursor desirably is subjected to one or more chalcogenization treatments. Chalcogenization generally refers to exposing the second film precursor to at least one chalcogen source under conditions to cause the chalcogen content of the second film to increase. For instance, if the second film precursor includes a sub-stoichiometric amount of chalcogen(s), chalcogenization can be carried out so that the chalcogen content is increased to be substantially at the stoichiometric amount, or even in excess relative to the stoichiometric amount. Chalcogenization generally helps convert the second PACB precursor film into a photoactive chalcopyrite film with substantially isotropic phase formation throughout the film.

The one or more chalcogen sources used for chalcogenization may include one or more gases, solids, liquids, gels, combinations of these, and the like. Exemplary gas phase sources of chalcogen include $H_2S$, $H_2Se$, combinations of these, and the like. In some illustrative embodiments, the gas source is generated as vapor via evaporation from solid or liquid material and is present in an overpressure in order to facilitate mass transfer of chalcogen into the film. Exemplary solid phase chalcogen sources include S or Se, combinations of these, and the like. In some illustrative embodiments, a solid cap of one or more chalcogen-containing species is provided in intimate contact with the surface of the second precursor film to carry out chalcogenization. In other illustrative embodiments, chalcogenization may be carried out by exposing the second precursor film to both gas phase chalcogen source(s) as well as one or more solid caps.

Chalcogenization often occurs at temperature(s) that are sufficiently high to achieve the desired chalcogenization in a reasonable time period without undue risk of degrading components of the workpiece(s) being treated. In exemplary embodiments involving selenization and/or sulfurization, a chalcogenization treatment may occur at one or more temperatures of at least about 400° C., preferably at least about 450° C. In some embodiments, this temperature is less than about 700° C., preferably less than about 575° C. The treatment desirably occurs for a time period of at least about 10 seconds, preferably at least about 2 minutes. In many embodiments, this time period is less than about 2 hours, desirably less than about 10 minutes. Additional time may be used to ramp temperature up and down according to a desired ramp profile. Ranges of ramp speeds commonly used include 30° C./min to 350° C./min or higher. The chalcogen source may be applied and removed at any time(s) during such ramps as desired. The chalcogen supply may be maintained as the sample cools down to approximately 200° C. to about 400° C. to help avoid loss of chalcogen from the near surface of the film.

An optional crystallization step may be carried out in order to convert the second precursor film to the final desired crystal form in the event the film is not yet in such form. For instance, if sputtering occurs at a temperature below about 500° C., crystallization may be required to convert the second precursor film into a desired chalcopyrite structure with grains leading to high electronic quality. On the other hand, above about 500° C., the second precursor film may already be in the desired crystalline form and an anneal itself may not be needed. Even in such instances, may be desirable to anneal in any event to improve crystalline characteristics. Chalcogenization is performed even if annealing is not needed or desirable.

The optional crystallization step can be carried out using any desired methodology. Annealing the second film precursor at suitable temperature(s) for a suitable time period at a suitable pressure is one convenient way to accomplish annealing. Because chalcogenide is already distributed throughout at least a portion of the film, the temperature and/or time to achieve desired crystallization may be less than if the precursor is chalcogen-free and is formed using conventional techniques. As general guidelines, annealing may occur at a temperature in the range from about 400° C. to about 650° C. for a time period in the range from about 10 seconds to about 20 mins. Desirably, annealing may occur in a suitable protected, non-oxidizing, dry environment such as a vacuum. The optional annealing step may occur prior to subsequent chalcogenization. Alternatively, annealing may occur at least in part or wholly at the same time that chalcogenization is carried out.

In many embodiments, the resultant photoactive chalcogenide materials useful in the second film preferably incorporate at least one IB-IIIB-chalcogenide, such as selenides, sulfides, tellurides, and/or combinations of these that include at least one of copper, indium, aluminum, and/or gallium. More typically at least two or even at least three of Cu, In, Ga, and Al are present. Sulfides and/or selenides are preferred. In many embodiments, these materials are present in polycrystalline form. Some embodiments include sulfides and/or selenides of copper and indium. Additional embodiments include selenides or sulfides of copper, indium, and gallium. Specific examples include but are not limited to copper indium selenides, copper indium gallium selenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as PACB materials). Such materials are referred to by acronyms such as CIS, CISS, CIGS, CIGST, CIGSAT, and/or CIGSS compositions, or the like. PACB materials also may be doped with other materials, such as Na, Li, or the like, to enhance performance. In many embodiments, PACB materials have p-type characteristics.

Oxygen (O) is technically a chalcogen according to its placement in the periodic table of the elements. However, oxygen is deemed not to be a chalcogen for purposes of the present invention inasmuch as oxygen does not contribute to photoabsorbing functionality to the extent of the other chalcogens such as S and/or Se. Even though oxygen does not promote photoabsorbing functionality to the same degree and/or in the same manner as Se or S, oxygen may still be incorporated into PACB materials, e.g., many chalcogen materials could incorporate at least some oxygen as an impurity that does not have significant deleterious effects upon electronic properties.

Advantageously, the chalcogen-containing, photoabsorbing materials exhibit excellent cross-sections for light absorption that allow photoactive films incorporating these materials to be very thin and flexible. In illustrative embodiments, a typical absorber region may have a thickness in the range of at least about 0.8 μm, preferably at least about 1 μm. In some embodiments, this thickness is less than about 5 μm, preferably less than about 2 μm. In other embodiments, the unique aspects of the tie layer films as discussed yield photovoltaic cells with an absorber thickness range of 300 to less than 500 nm. The absorber thickness as measured post-processing includes both the first (tie) layer and the second and any other subsequent layers unless otherwise expressly noted.

One preferred class of PACB materials useful in the second film may be represented by the formula $$Cu_a In_b Ga_c Al_d Se_w S_x Te_y Na_z \qquad (A)$$

Wherein, if "a" is defined as 1, then:
"(b+c+d)/a"=1 to 2.5, preferably 1.05 to 1.65
"b" is 0 to 2, preferably 0.8 to 1.3
"c" is 0 to 0.5, preferably 0.05 to 0.35
d is 0 to 0.5, preferably 0.05 to 0.35, preferably d=0
"(w+x+y)" is 1 to 3, preferably 2 to 2.8
"w" is 0 or more, preferably at least 1 and more preferably at least 2 to 3

"x" is 0 to 3, preferably 0 to 0.5
"y" is 0 to 3, preferably 0 to 0.5
"z" is 0 to 0.5, preferably 0.005 to 0.02

The copper indium selenides/sulfides and copper indium gallium selenides/sulfides are preferred. Strictly stoichiometric illustrative examples of such photoelectronically active PACB materials may be represented by the formula

$$CuIn_{(1-x)}Ga_xSe_{(2-y)}S_y \quad\quad (B)$$

where x is 0 to 1 and y is 0 to 2. As measured and processed, such films usually include additional In, Ga, Se, and/or S. Corresponding precursors of such PACB materials generally would include constituents in the same proportions as specified in Formula A or B, including additional In and/or Ga as applicable to compensate for In loss during post-chacogenization, except that the chalcogen content is sub-stoichiometric in the precursor.

After forming the tie layer(s) and overlying PACB layer(s), additional layers and features can be formed to build and complete a photovoltaic device. Generally, these layers and features may be formed as a single integral layer, but these also can be formed from one or more layers.

For example, a buffer layer may be formed over the PACB material. The use of buffer layers has been shown to enhance the electronic performance of photovoltaic devices. In some embodiments, a buffer layer generally comprises an n-type semiconductor material with a suitable band gap to help form a p-n junction or otherwise enhance the electrical interface proximal to the interface between the absorber region and overlying electrical contacts. Suitable band gaps for a typical buffer region generally are in the range from about 1.7 eV to about 3.6 eV. Illustrative embodiments of a buffer region generally may have a thickness in the range from about 5 nm to about 200 nm.

A wide range of n-type semiconductor materials may be used to form buffer regions. Illustrative materials include selenides, sulfides, and/or oxides of one or more of cadmium, zinc, lead, indium, tin, combinations of these and the like, optionally doped with materials including one or more of fluorine, sodium, combinations of these and the like. In some illustrative embodiments, the buffer region is a selenide and/or sulfide including cadmium and optionally at least one other metal such as zinc. Other illustrative embodiments would include sulfides and/or selenides of zinc. Additional illustrative embodiments may incorporate oxides of tin doped with material(s) such as fluorine. Buffer layer technology is further described in D. Hariskos, et al, "Buffer layers in Cu(In,Ga) Se2 solar cells and modules," Thin Solid Films, 2005, 480-481, 99-109; C. Platzer-Bjorkman, et al, "Zn(O,S) Buffer Layers by Atomic Layer Deposition . . . " Journal of Applied Physics, 2006, 100, 044506; U. Maim, et al, "Determination of dominant recombination paths . . . ", Thin Solid Films, 2005, 480-481, 208-212; and Y. Kim, et al, "Studies on Polycrystalline ZnS thin films . . . " Applied Surface Science, 2004, 229, 105-111.

Another layer that may be used is an optional window layer, typically formed over the buffer layer. The window layer in some embodiments may help to protect against shunts. The window region also may protect the underlying photoactive layers during subsequent deposition of a transparent conductive layer or other electrically conductive layer(s) formed over the window region. The window region may be formed from a wide range of materials and often is formed from a resistive, transparent oxide such as an oxide of Zn, In, Cd, Sn, combinations of these and the like. An exemplary window material is intrinsic ZnO. A typical window region may have a thickness of at least about 10 nm, preferably at least about 50 nm, more preferably at least about 80 nm. Desirably, the window region has a thickness that is less than about 200 nm, preferably less than about 150 nm, more preferably less than about 120 nm.

One or more electrical conductors are incorporated into a device for the collection of current generated by the photoactive structure. A wide range of electrical conductors may be used. Generally, electrical conductors are included on both the backside and light incident side of the photoactive structure in order to complete the desired electric circuit. On the backside, for example, backside electrical contact region provides a backside electrical contact in representative embodiments. On the light incident side of the photoactive structure in representative embodiments, a typical device incorporates a transparent conductive layer and a collection grid. A transparent conductive layer is generally formed as a top contiguous active layer over the buffer or window layers in many embodiments. Transparent conductive oxides, such as indium tin oxide, zinc oxides or aluminum doped zinc oxides and the like are preferred. Optionally an electrically conductive ribbon may also be used to electrically couple the collection grid to external electrical connections.

A photovoltaic device usually incorporates a suitable support on which the other layers and features are fabricated. Such a support may be rigid or flexible, but desirably is flexible in those embodiments in which the device may be used in combination with non-flat surfaces. A support may be formed from a wide range of materials. These include glass, quartz, other ceramic materials, polymers, metals, metal alloys, intermetallic compositions, paper, woven or non-woven fabrics, combinations of these, and the like. Stainless steel is preferred in many embodiments.

A backside electrical contact region provides a convenient way to electrically couple the resultant device to external circuitry. The backside contact region may be formed from a wide range of electrically conductive materials, including one or more of Cu, Mo, Ag, Al, Cr, Ni, Ti, Ta, Nb, W combinations of these, and the like. Conductive compositions incorporating Mo may be used in an illustrative embodiment. The backside electrical contact region also helps to isolate the absorber region from the support to minimize migration of support constituents into the absorber layer. For instance, a backside electrical contact region can help to block the migration of Fe and Ni constituents of a stainless steel support into the absorber region. The backside electrical contact region also can protect the support such as by protecting against Se if Se is used in the formation of absorber region.

A protective barrier system desirably is provided. The protective barrier system is positioned over the electronic grid and helps to isolate and protect the device from the environment, including protection against water degradation. The barrier system optionally also may incorporate elastomeric features that help to reduce the risk of damage to device due to delamination stresses, such as might be caused by thermal cycling and or localized stress such as might be caused by impact from hail and or localized point load from the weight of an installer or dropped tools during installation. Each of these regions may be a single layer or can be formed from one or more layers.

The present invention will now be further described with reference to the following illustrative examples.

EXAMPLE 1

A commercially sourced, multiphase CIGS target is sputtered at ambient temperature. A resultant tie layer had the following composition: Se/Cu atomic ratio=1.23; (Ga+In)/

Cu atomic ratio=1.12; total deposition thickness of Cu+Ga+In+Se is approximately 200 nm. The actual PACB precursor would then be deposited on top of this tie layer. The precursor can be formed using a variety of techniques, such as sputtered CIG, sputtered sub-selenized CIGS, or other material.

EXAMPLE 2

The procedure of Example 1 is repeated, except a tie layer is formed with a total deposition thickness of about 50 nm.

EXAMPLE 3

Photovoltaic (PV) devices were fabricated using stainless steel foil substrates (4 mil), with Nb and Mo layers deposited on the foils. On one substrate, a tie layer was deposited by sputtering a commercially sourced CIGS target at 4×10−3 mbar pressure in ultra pure Ar at ambient temperature. The thickness of the film as deposited was ~200 nm. PACB precursor material was then deposited on all pieces by the sputtering of CIG alloy targets (commercially sourced) in Ar. Conditions were: 4×10−3 mbar pressure ultra pure Ar at ambient temperature. Deposition thickness was controlled such that approximately 800 nm (average thickness) of CIG was deposited. A thick Se cap was evaporated on top of this CIG film (>12 times the amount to render the film stoichiometric), and the film stack was post-selenized at 515° C. for 20 minutes. Dry CdS and window layer depositions followed and the devices were gridded and scribed.

FIG. 1 shows efficiency results for eight photovoltaic (PV) cells formed with a tie layer (data points on right side of graph) and eight photovoltaic cells formed without a tie layer (data points on left side of graph). Note the reduced variability in the tie layer samples leading to a higher average efficiency, while the maximum efficiency is unchanged even though the tie layer has a fine grain structure that is not optimized for electronic performance.

Figure 2:
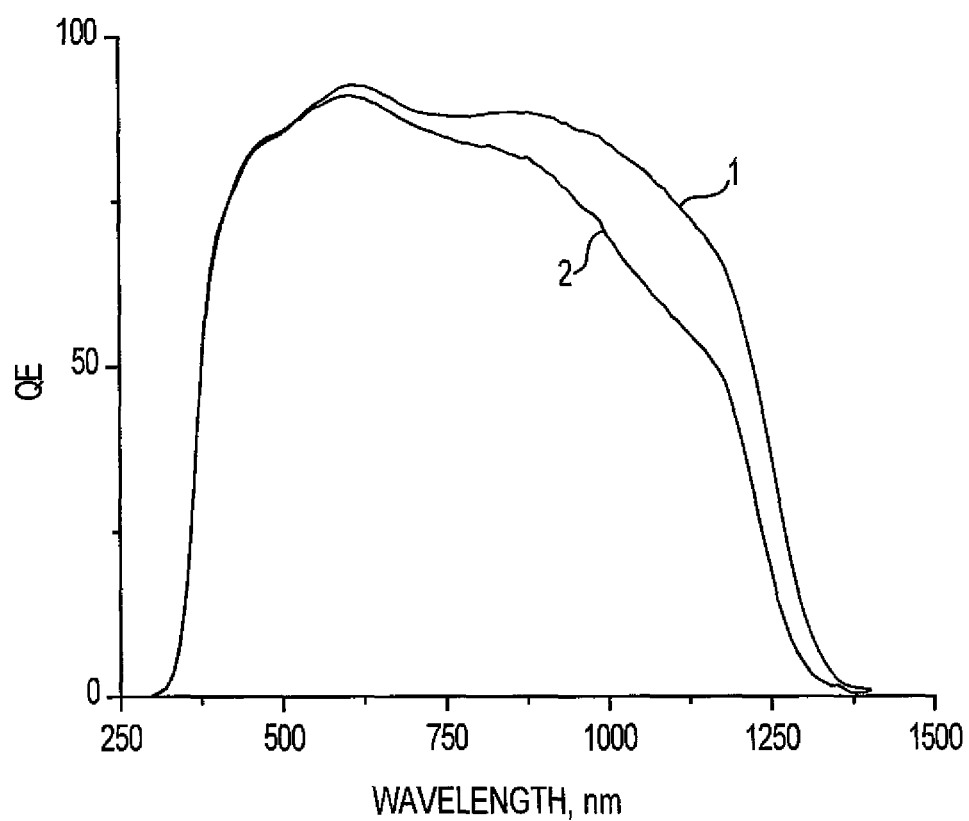
FIG. 2 is a graph referred to in Example 3 below that shows quantum efficiency measurements of the highest performing cell with a tie layer (curve 1) and the highest performing cell without a tie layer (curve 2).

FIG. 2 shows quantum efficiency measurements of the highest performing cell with a tie layer (curve 1) and the highest performing cell without a tie layer (curve 2). Note that the bandgap is identical for both cells (from fitting of the crossover point). However, a significant difference in absorption exists which may be indicative of reduced electronic defects for the tie layer sample of curve 1.

EXAMPLE 4

PV devices were fabricated using stainless steel foil substrates (4 mil), with Nb and Mo layers deposited on the foils. On one substrate, a tie layer was deposited on the Mo surface by sputtering a commercially sourced CIGS target at 4×10−3 mbar pressure in ultra pure Ar at ambient temperature. The thickness was ~200 nm. PACB precursor material was then deposited on all pieces by the reactive sputtering of CIG alloy targets (commercially sourced) in Ar+$H_2$Se such that 3.3% of the flow was $H_2$Se. This resulted in a precursor film with ~30 wt. %. Se (Se/Cu atomic ratio ~1.0; (In+Ga)/Cu atomic ratio ~1.2). Sputter conditions were: 4×10−3 mbar pressure, ultra pure Ar, ambient temperature substrate. Deposition thickness was controlled such that the average film thickness was ~800 nm. A thick Se cap was evaporated (>12 times the amount to render the film stoichiometric), and the film stack was post-selenized at ~515° C. for 20 minutes. Dry CdS and window layer depositions followed, and the devices were gridded and scribed.

The film without a tie layer exhibited very poor adhesion. A layer of voids existed between the PACB film and back contact. The improvement in adhesion is very clear when the tie layer is used. In the sample with a tie layer, XTEM analysis showed that the voids are now moved substantially into the PACB film itself.

Figure 3:
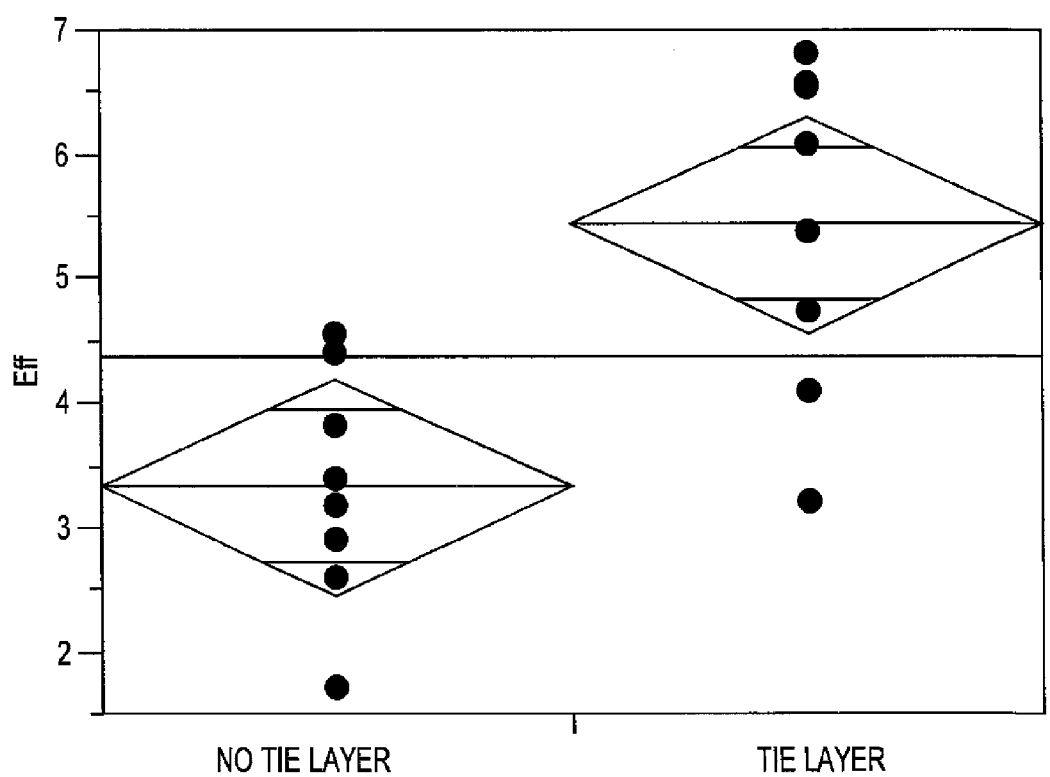
FIG. 3 is a graph that shows an efficiency comparison between samples with and without tie layers.

FIG. 3 shows an efficiency comparison between samples with and without tie layers. The data for samples without a tie layer are shown on the left. The data for samples with a tie layer are shown on the right. Note how the maximum efficiency and average efficiency are substantially higher for the samples with a tie layer.

EXAMPLE 5

PV devices were fabricated using techniques described in Example 4 except that the conditions were modified to compare the impact of reducing the thickness of the tie layer and to reduce the thickness of the PACB layer. Data are shown in FIGS. 4, 5 and 6.

Figure 4:
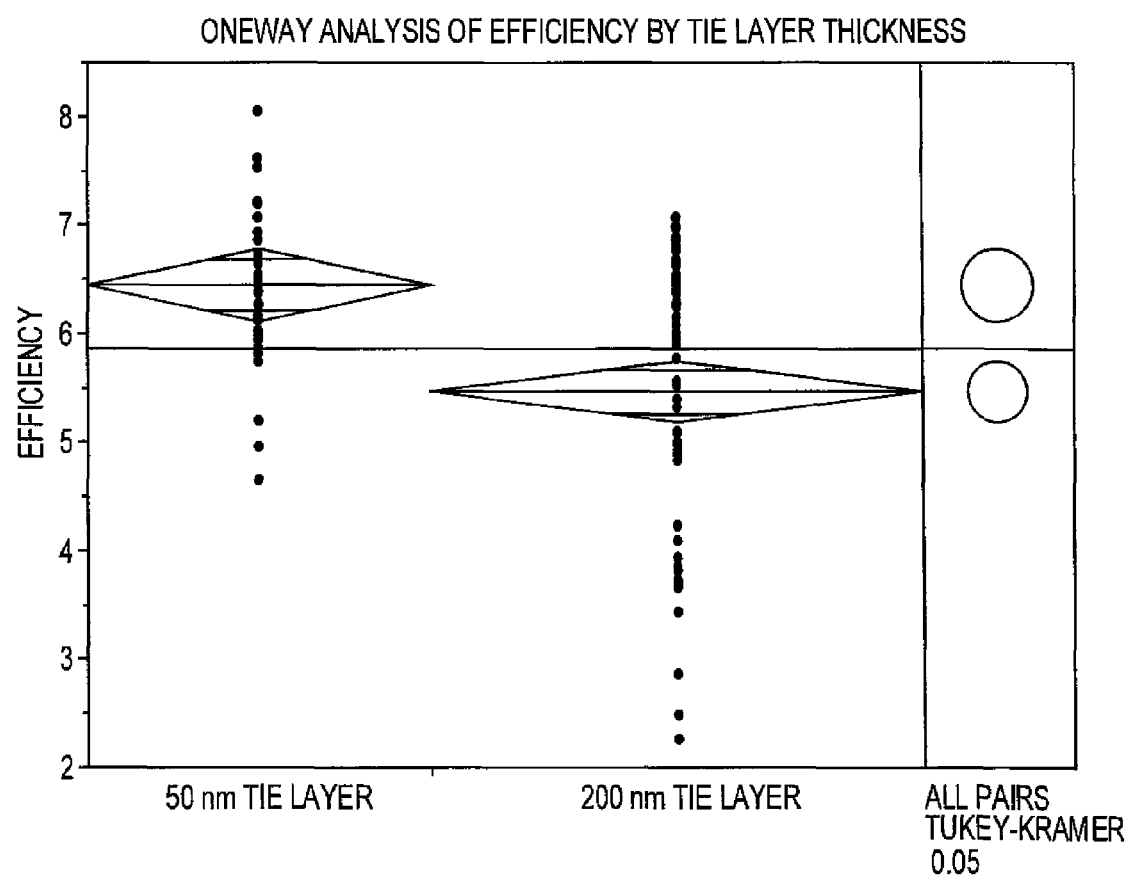
FIG. 4 is a graph that compares the performance of samples having a 50 nm tie layer to samples with a 200 nm tie layer.

In FIG. 4, the performance of samples having a 50 nm tie layer was compared to samples with a 200 nm tie layer. PACB layer overlying the tie layer was 800 nm thick in all samples. The thinner tie layer provided higher efficiency, but adhesion was excellent for all samples.

Figure 5:
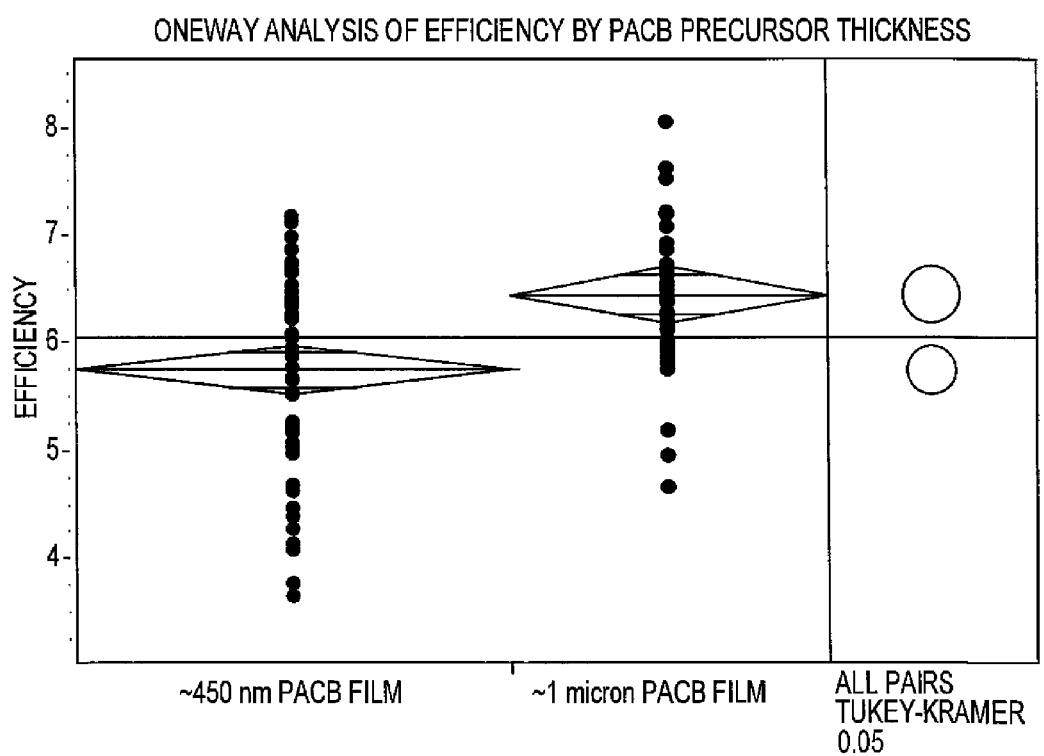
FIG. 5 is a graph that compares samples having an overlying PACB layer with a thickness of about 450 nm to samples having an overlying PACB layer with a thickness of about 1 micron, wherein both sets of samples had tie that were about 50 nm thick.

In FIG. 5, the tie layers in all samples were about 50 nm thick. Samples having an overlying PACB layer with a thickness of about 450 nm were compared to samples having an overlying PACB layer with a thickness of about 1 micron. On average, there is a slight efficiency reduction of only approximately 0.5 points with the thinner PACB layers. Adhesion was excellent for all samples Note: without any tie layer, the ~450 nm final thickness cells would likely all have shown 0% efficiency.

Figure 6:
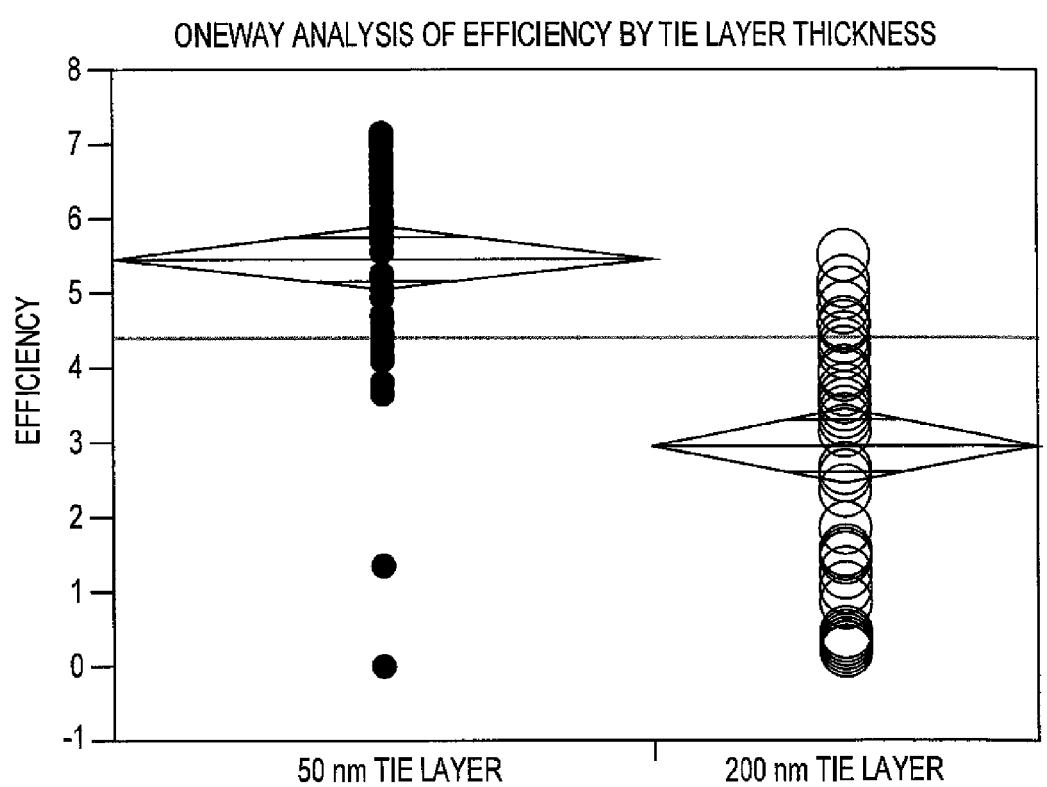
FIG. 6 is a graph that compares samples including ultrathin PACB layers (about 450 nm thick) and tie layers of different thicknesses (50 nm and 200 nm).

In FIG. 6, ultra-thin PACB layers (about 450 nm thick) with tie layers of different thicknesses (50 nm and 200 nm) were compared. The thinner tie layers clearly yield improved efficiency performance.

The data shown in FIGS. 4 through 6 leads to the following conclusions:

Thinner tie layer gives better efficiency results.

Only a slight drop in efficiency (0.5% points) observed for ultra-thin PACB precursor layers.

The efficiency drop due to thin PACB precursor layers is less for the thinner tie layer than the thicker tie layer.

A 300-500 nm thick PACB layer (measured post selenization and annealing) was used to produce cells at 7% efficiency when using a thin (50 nm) tie layer, which is remarkable since ordinarily a PACB layer this thin would be expected to be nonfunctional.

What is claimed is:

1. A method of making a chalcogen-containing photoabsorbing structure, comprising the steps of:
    (a) forming a first film precursor capable of being converted into a first PACB film, the first film precursor comprising at least Cu, In, optionally at least one of Ga and Al, and at least one chalcogen, wherein at least a portion of said forming of the first film precursor occurs at a temperature of less than about 350° C. and wherein the first film precursor as deposited includes at least 50% of the stoichiometric amount of the at least one chalcogen relative to the Cu, In, optional Ga, and optional Al; and
    (b) forming a second PACB film directly or indirectly on the first film precursor or the first PACB film, wherein the second PACB film is photoactive and comprises at least Cu and In and a chalcogen, and wherein a major portion of the second PACB film has a crystal grain size greater than 300 nm; and (c) subjecting at least the first film precursor and optionally a precursor of the second PACB film to an annealing and/or chalcogenization treatment under conditions effective to convert the first film precursor into the first PACB film, wherein a major portion of the first PACB film comprises crystalline grains having a size in the range from about 5 nm to about 100 nm such that the first PACB film has a finer grain structure than the second PACB film.

2. The method of claim 1, wherein a major portion of the first PACB film comprises crystalline grains having a size in the range from 8 nm to about 50 nm.

3. The method of claim 1, wherein the first film precursor as deposited has a thickness in the range from about 10 nm to about 50 nm.

4. The method of claim 1, wherein the first film precursor as deposited further comprises at least one of Ga and Al.

5. The method of claim 4, wherein the atomic ratio of (In+Ga+Al) to the amount of copper in the first film precursor as deposited is greater than 1.

6. The method of claim 1, wherein the first film precursor as deposited includes from about 60 to about 100 percent of the stoichiometric amount of at least one chalcogen relative to (Cu+In+Ga+Al) in the first film precursor as deposited.

7. The method of claim 1, wherein at least a majority of the first film precursor is deposited at one or more temperatures below about 200° C.

8. The method of claim 1, wherein at least a majority of the first film precursor is deposited at one or more temperatures below about 65° C.

9. The method of claim 1, wherein at least a portion of step (c) occurs prior to forming the second PACB film.

10. The method of claim 1, wherein the first film precursor is formed via sputtering.

11. The method of claim 1, wherein the at least one chalcogen of the first film precursor includes at least one of Se and S.

12. The method of claim 1, wherein the first film precursor is formed on a surface including at least molybdenum.

13. The method of claim 1, wherein the second PACB film comprises copper, indium, at least one of selenium or sulfur, and optionally gallium.

14. The method of claim 1, wherein the second PACB film has a thickness in the range from about 300 nm to about 800 nm.

15. The method of claim 1, wherein step (b) further comprises forming the second PACB film to have a thickness in the range from about 200 nm to about 1000 nm.

* * * * *